(12) United States Patent
Gauthier et al.

(10) Patent No.: US 10,108,823 B2
(45) Date of Patent: Oct. 23, 2018

(54) CONFIGURING AN EMBEDDED ELECTRONIC DEVICE BY READING A RADIOFREQUENCY TAG

(71) Applicant: AIRBUS OPERATIONS S.A.S., Toulouse (FR)

(72) Inventors: Stéphane Gauthier, Toulouse (FR); Juan Lopez, Grenade (FR); Emilie Claudel, Leguevin (FR)

(73) Assignee: AIRBUS OPERATIONS S.A.S., Toulouse (FR)

( * ) Notice: Subject to any disclaimer, the term of this patent is extended or adjusted under 35 U.S.C. 154(b) by 15 days.

(21) Appl. No.: 15/790,913

(22) Filed: Oct. 23, 2017

(65) Prior Publication Data
US 2018/0121687 A1    May 3, 2018

(30) Foreign Application Priority Data

Oct. 27, 2016    (FR) .................... 16 60419

(51) Int. Cl.
*G06K 7/10*    (2006.01)
*B64D 47/02*    (2006.01)
(Continued)

(52) U.S. Cl.
CPC ......... *G06K 7/10009* (2013.01); *B64D 47/02* (2013.01); *G06K 17/0022* (2013.01);
(Continued)

(58) Field of Classification Search
CPC ....... G06K 7/10009; G06K 2017/0045; G06K 17/0022; G06K 17/0029; B64D 47/02; H05K 7/14
See application file for complete search history.

(56) References Cited

U.S. PATENT DOCUMENTS

2005/0162256 A1*    7/2005    Kinoshita ........ G06K 19/07749
340/10.41
2013/0335197 A1    12/2013    Oder et al.
(Continued)

FOREIGN PATENT DOCUMENTS

EP    3 086 266 A1    10/2016
FR    2 992 081 A1    12/2013
(Continued)

OTHER PUBLICATIONS

Search Report dated Jun. 23, 2017, by the French Patent Office for Application No. 1660419.

*Primary Examiner* — Sonji Johnson
(74) *Attorney, Agent, or Firm* — Buchanan Ingersoll & Rooney PC

(57) ABSTRACT

The disclosure relates to a system embedded in an airplane comprising an electronic device intended to be inserted into a frame, a frame that can accommodate the electronic device, in which system the electronic device includes a radiofrequency tag reader, a radiofrequency tag, having a configuration information item, is fixed to the frame such that the radiofrequency tag reader can read the radiofrequency tag once the electronic device is inserted into the frame and the electronic device is adapted to, in a phase of configuration of the electronic device: read the configuration information item via the radiofrequency tag reader and determine a configuration of the electronic device as a function of the configuration information item read.

10 Claims, 3 Drawing Sheets

Figure 1A:
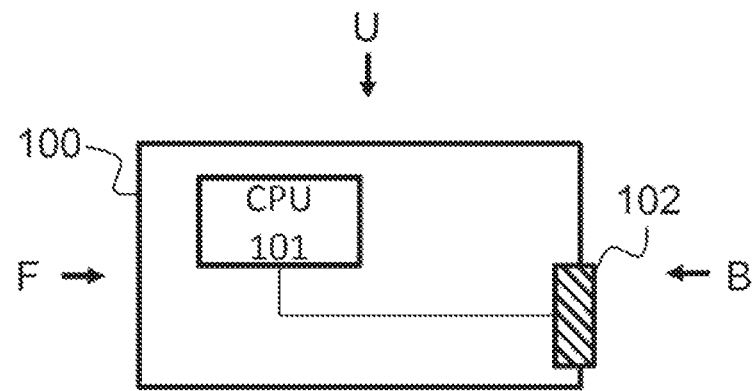

(51) Int. Cl.
*H05K 7/14* (2006.01)
*G06K 17/00* (2006.01)

(52) U.S. Cl.
CPC ........... *G06K 17/0029* (2013.01); *H05K 7/14* (2013.01); *G06K 2017/0045* (2013.01)

(56) References Cited

U.S. PATENT DOCUMENTS

| | | |
|---|---|---|
| 2014/0245285 A1 | 8/2014 | Krenz |
| 2014/0313016 A1 | 10/2014 | Nizam et al. |
| 2016/0092192 A1 | 3/2016 | Frayssignes et al. |
| 2016/0314328 A1 | 10/2016 | Hosamane et al. |

FOREIGN PATENT DOCUMENTS

| | | |
|---|---|---|
| FR | 3 004 566 A1 | 10/2014 |
| FR | 3 026 509 A1 | 4/2016 |

\* cited by examiner

CONFIGURING AN EMBEDDED ELECTRONIC DEVICE BY READING A RADIOFREQUENCY TAG

The present invention relates to the field of systems embedded in an airplane.

An airplane comprises a multitude of electronic devices providing various functions (navigation systems, smoke detectors, alarm computers, etc.). In order to facilitate maintenance, these electronic devices are made easily replaceable by being removably mounted in frames. That allows an operator to extract a faulty electronic device from its frame in order to replace it with another electronic device providing the same function. This is called Line Replaceable Unit (or LRU). However, a given electronic device, providing a certain function, for example a smoke detector, may be used at several points in an airplane, and therefore exist in several copies in one and the same airplane. Likewise, one and the same electronic device may be used in airplanes of different types. Conventionally, these different situations are managed by a configuration method called "Hardware Pin Programming" (HPP). In this method, the electronic device being linked to the airplane via a connector, some dedicated pins of the connector on the airplane side are connected to the ground, or left open. Thus, each dedicated pin can code an information item on a bit (two possible values). This method makes it possible to code, on a certain number of dedicated pins of the connector, one or more configuration information items, read by the electronic device in a configuration phase. That allows the electronic device to have a different operation and/or a different configuration according to its location. However, this method presents at least two problems. First of all since the number of pins of a connector is limited, typically of the order of a few hundred, the capacity to store configuration information items is physically limited. Thus, it is for example difficult to configure an IP address of the electronic device by means of the abovementioned pins. Furthermore, since the number of pins of a connector is limited, it is desirable to reduce the number of pins dedicated to HPP in order to allow the use of the remaining pins for the functions that the electronic device has to fulfil, in particular for inputs/outputs of the electronic device associated with these functions.

It is therefore necessary to propose a system that possibly makes it possible to reduce the number of pins dedicated to HPP while allowing a greater configuration information storage capacity.

The invention relates to a system embedded in an airplane comprising an electronic device intended to be inserted into a frame, a frame that can accommodate the electronic device, in which system the electronic device comprises a radiofrequency tag reader, a radiofrequency tag, comprising a configuration information item, is fixed to the frame such that the radiofrequency tag reader can read said radiofrequency tag once the electronic device is inserted into the frame; the electronic device being adapted to, in a phase of configuration of the electronic device, read the configuration information item by means of the radiofrequency tag reader and determine a configuration of the electronic device as a function of the configuration information item read.

Advantageously, the electronic device can thus read a configuration information item without pins of a connector having to be dedicated to HPP. It is also possible to reduce the number of pins dedicated to HPP. More generally, the system makes it possible to provide a configuration information item to an electronic device by the simple addition of a radiofrequency tag fixed to the frame. This solution is therefore quick, simple and inexpensive given the typical cost of a radiofrequency tag of RFID (RadioFrequency IDentification) type.

According to an additional embodiment of the invention, the electronic device being adapted to provide at least one function to the airplane, the configuration information item comprises at least one of the following information items: an IP address, an information item relating to a position of the electronic device in the airplane, an information item relating to the type of the airplane in which the electronic device is installed or an information item relating to the activation or to the deactivation of a function of the electronic device.

According to an additional embodiment of the invention, the radiofrequency tag being accessible in write mode, the radiofrequency tag reader is adapted to write an information item on the radiofrequency tag.

According to an additional embodiment of the invention, an information item written in the radiofrequency tag by the radiofrequency tag reader corresponds to at least one of the following information items: a version number corresponding to a version of software downloaded into the electronic device, a value of a setting associated with the airplane, an information item relating to a failure of the electronic device or a decryption or control key that can be used when downloading software into the electronic device.

The invention relates also to an electronic device intended to be inserted into a frame of an airplane, the electronic device comprising a radiofrequency tag reader positioned so as to be able to read a radiofrequency tag, the radiofrequency tag comprising a configuration information item and being fixed to the frame, once the electronic device is inserted into the frame, the electronic device being adapted to, in a phase of configuration of the electronic device, read the configuration information item by means of the radiofrequency tag reader and determine a configuration of the electronic device as a function of the configuration information item read.

According to an additional embodiment of the invention, the electronic device being adapted to provide at least one function to the airplane, the configuration information item comprises at least one of the following information items: an IP address, an information item relating to a position of the electronic device in the airplane, an information item relating to the type of the airplane in which the electronic device is installed or an information item relating to the activation or to the deactivation of a function of the electronic device.

According to an additional embodiment of the invention, the radiofrequency tag being accessible in write mode, the radiofrequency tag reader being adapted to write an information item on the radiofrequency tag, an information item written in the radiofrequency tag by the radiofrequency tag reader corresponds to at least one of the following information items: a version number corresponding to a version of software downloaded into the electronic device, a value of a setting associated with the airplane, an information item relating to a failure of the electronic device or a decryption or control key that can be used when downloading software into the electronic device.

The invention relates also to a method for configuring an electronic device intended to be inserted into a frame of an airplane, the electronic device comprising a radiofrequency tag reader, a radiofrequency tag being fixed to the frame such that the radiofrequency tag reader can read said radiofrequency tag once the electronic device is inserted into the frame, the method being executed by the electronic device and comprising the steps of: reading the configuration information item by means of the radiofrequency tag reader and determining a configuration of the electronic device as a function of the configuration information item read.

According to an additional embodiment of the invention, the electronic device being adapted to provide at least one function to the airplane, the configuration information item comprises at least one of the following information items: an IP address, an information item relating to a position of the electronic device in the airplane, an information item relating to the type of the airplane in which the electronic device is installed or an information item relating to the activation or to the deactivation of a function of the electronic device.

The invention relates also to a computer program which can be stored on a medium and/or downloaded from a communication network, in order to be read by a processor. This computer program comprises instructions for implementing all or some of the steps mentioned hereinbelow, when said program is executed by the processor.

The invention relates also to an information storage medium comprising such a computer program.

Figure 1B:
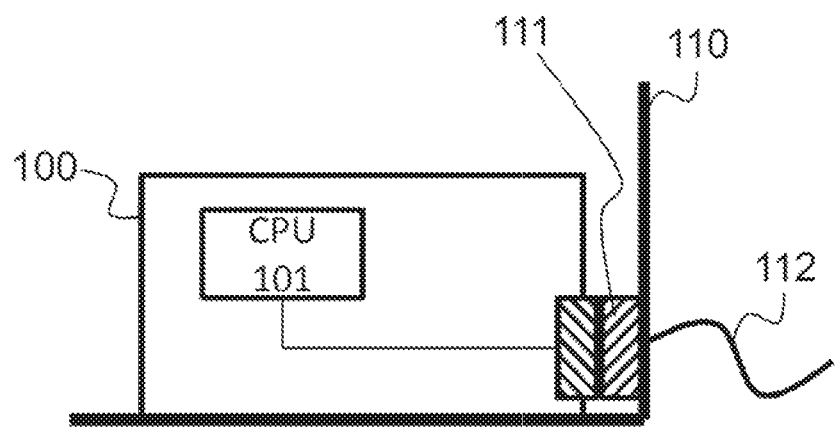
Figure 2A:
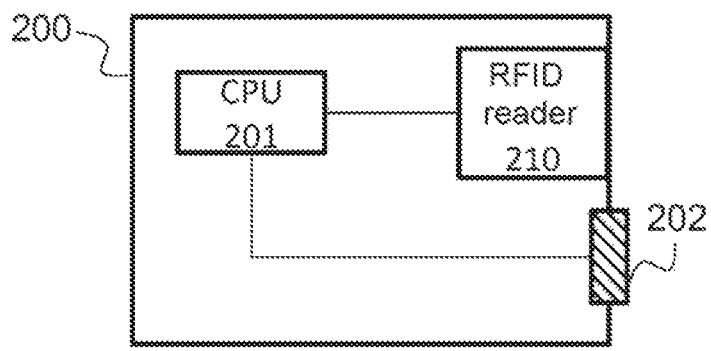
Figure 2B:
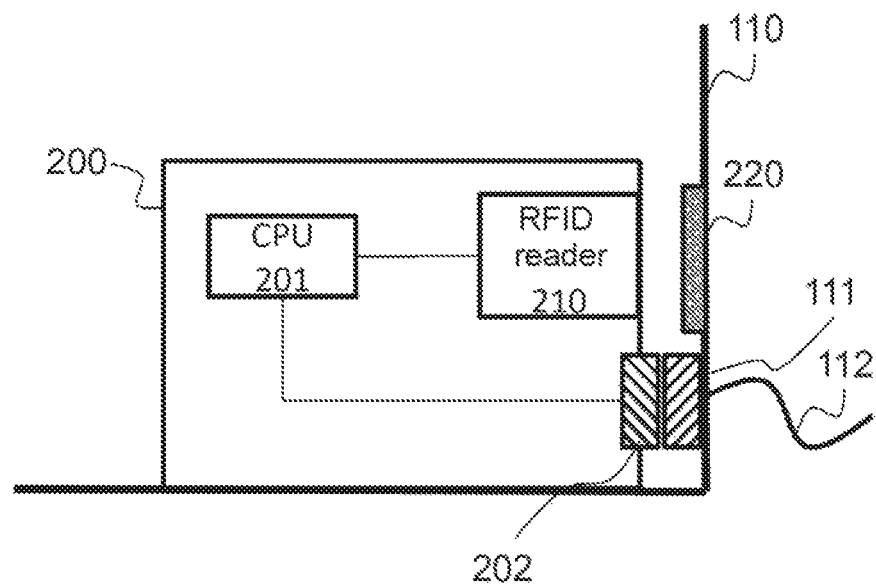
Figure 3:
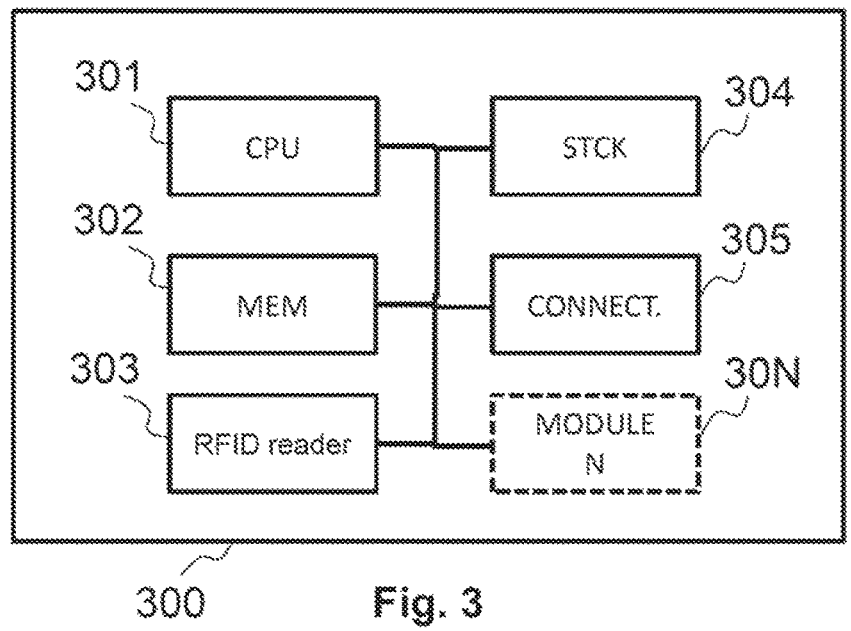
Figure 4:
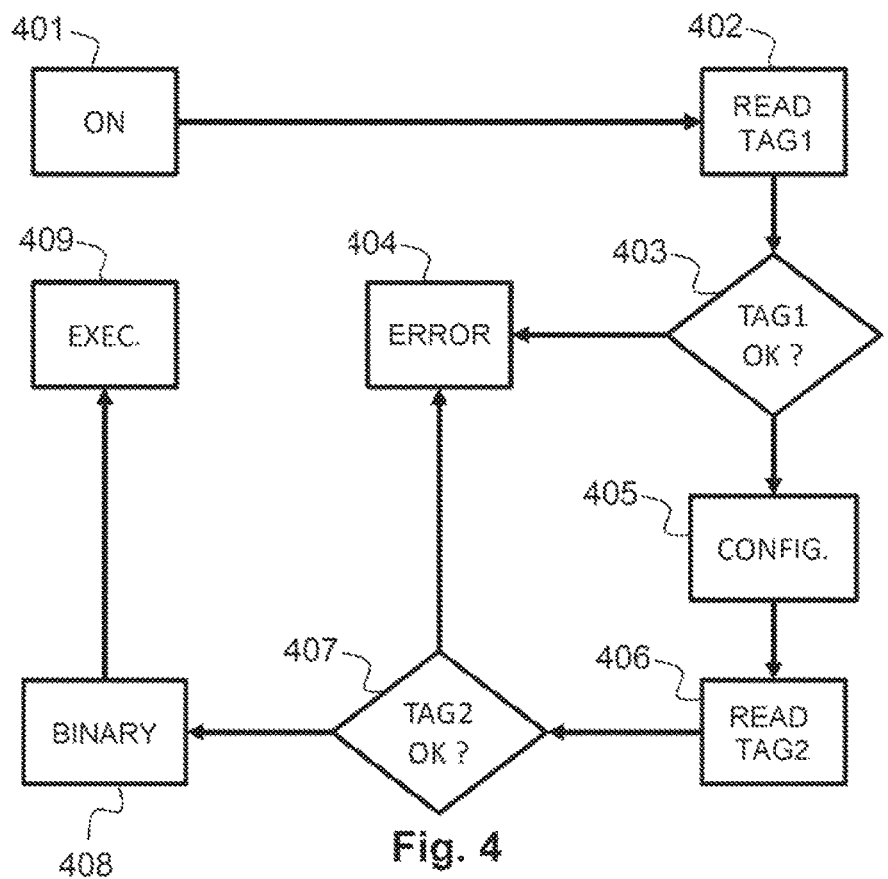

The features of the invention mentioned above, and others, will become more clearly apparent on reading the following description of an exemplary embodiment, said description being given in relation to the attached drawings, in which:

FIGS. 1A and 1B schematically illustrate an electronic device intended to be inserted into a frame of an airplane as known to those skilled in the art;

FIGS. 2A and 2B schematically illustrate an electronic device intended to be inserted into a frame of an airplane according to an embodiment of the invention;

FIG. 3 schematically illustrates an electronic device intended to be inserted into a frame of an airplane and adapted to implement a configuration method according to an embodiment of the invention;

FIG. 4 schematically illustrates a method for configuring an electronic device intended to be inserted into a frame of an airplane according to an embodiment of the invention.

FIG. 1A illustrates an electronic device 100 comprising a connector 102 and a processor 101. The electronic device is represented from the side, the view "F" representing the front view, the view "U" the view from above and the view "B" the view from behind. The connector 102 is generally placed behind the electronic device 100, as illustrated. The electronic device 100 is often called "equipment", "casing" or "unit".

The electronic device 100 often comprises a metal casing, and a ventilation system making it possible to cool components internal to the electronic device 100, such as the processor 101. In this case, it is common practice for the electronic device 100 to include, in its bottom part, one or more voids allowing the passage of fresh air and, generally at the top of the casing of the electronic device 100, a ventilation system making it possible to discharge the hot air.

FIG. 1B illustrates the electronic device 100 once inserted into a frame 110 that can accommodate the electronic device 100. The frame 110 comprises a connector 111, linked to the avionics of the airplane by a connection system 112. When the electronic device 100 is inserted into the frame 110, the connectors 102 and 111 are connected to one another, each connector comprising, for example, a suitable male or female part. Once connected, the electronic device 100 can, in a configuration phase, read the pins dedicated to HPP to determine a configuration. For example, an electronic device 100 that can be used in different types of airplanes can determine a configuration adapted to the airplane in which it is used from the moment when an information item associated with the type of airplane is encoded via the pins dedicated to HPP.

FIGS. 2A and 2B schematically illustrate an electronic device intended to be inserted into a frame of an airplane according to an embodiment of the invention.

The electronic device 200 illustrated in FIG. 2A is similar to the electronic device 100 previously described, except that the electronic device 200 comprises a radiofrequency tag reader 210. The radiofrequency tag reader 210 can be adapted to read different types of radiofrequency tag, for example a radiofrequency tag of RFID (RadioFrequency IDentification) type, and more particularly of NFC ("Near Field Communication") type. The use of a radiofrequency tag of NFC type, requiring, in order to function, a distance typically less than 10 centimeters between the radiofrequency tag reader and the radiofrequency tag read, makes it possible to avoid having the reading of a radiofrequency tag being disturbed by another radiofrequency tag installed on another electronic device nearby. If necessary, the power of the radiofrequency waves emitted by the radiofrequency tag reader 210 is adapted so as not to read a radiofrequency tag situated on another electronic device nearby.

If the casing of the electronic device 200 is metal, in order for the communication between the radiofrequency tag reader 210 and the radiofrequency tag not to be disturbed, the radiofrequency tag reader 210 is possibly placed in proximity to a void of the casing of the electronic device 200, such as the fresh air inlet situated on the bottom part of the electronic device 200 or the hot air outlet situated in the rear part of the electronic device 200. It is also possible to remotely site a radio antenna of the radiofrequency tag reader 210 outside the casing of the electronic device 200. For that, according to a first variant, the cable linking the radio antenna to the radiofrequency tag reader 210 passes through a hole made in the casing of the electronic device 200. According to a second variant, the connection between the radiofrequency tag reader and the antenna is produced via a connector disposed on the casing.

Alternatively, a part of a wall of the casing of the electronic device 200 consists of a material permeable to the radiofrequency waves emitted by the radiofrequency tag reader 210. An antenna of the radiofrequency tag reader 210 can then be placed inside the casing behind this part of the casing.

FIG. 2B illustrates the electronic device 200 once inserted into the frame 110. Compared to the illustration of FIG. 1B, a radiofrequency tag 220, comprising a configuration information item, is fixed to the frame 110 such that the radiofrequency tag reader 210 can read said radiofrequency tag 220 once the electronic device is inserted into the frame 110. The radiofrequency tag 220 is for example self-adhesive and stuck to the frame. The radiofrequency tag 220 can be of RFID type, and more particularly of NFC type. The radiofrequency tag reader 210 and the radiofrequency tag 220 are adapted for the radiofrequency tag reader 210 to be able to read data, such as the configuration information item, stored in the radiofrequency tag 220.

The radiofrequency tag 220 can belong to one of the following predefined classes depending on the functionalities offered by the radiofrequency tag 220:

class 0 and class 1: so-called "passive" read-only radiofrequency tag 220 (only a unique identifier of the radiofrequency tag 220 is readable), class 2: so-called "passive" radiofrequency tag 220 with additional functions (the radiofrequency tag 220 comprises a memory, called write memory, said memory being able to be written), class 3: so-called "passive" radiofrequency tag 220 comprising a battery, said battery making it possible to power, for example, a sensor included in the radiofrequency tag 220, class 4: so-called "active" radiofrequency tag 220 (a communication can be established between the radiofrequency tag 220 and the radiofrequency tag reader 210).

The radiofrequency tag 200 can comprise, associated with the configuration information item, an integrity information item. The integrity information item is typically an error detecting and/or correcting code, the value of the integrity information item being determined as a function of the configuration information item. The integrity information item can be a hash of the configuration information item. The integrity information item can be a digital signature associated with the configuration information item.

Here, the radiofrequency tag reader 210 being situated at the rear of the electronic device 200, the radiofrequency tag 220 is fixed above the connector 111 such that the radiofrequency tag reader 210 can read said radiofrequency tag 220 once the electronic device is inserted into the frame 110. According to another embodiment of the invention, the radiofrequency tag reader 210, or at the very least its radio antenna, is situated in the bottom part of the casing of the electronic device 200. In this case, the radiofrequency tag 220 is fixed to the frame such that the radiofrequency tag reader 210 can read said radiofrequency tag 220 once the electronic device is inserted into the frame 110. In other words, the electronic device 200 being inserted into the frame 110, the radiofrequency tag 220 is located under the electronic device 200. Preferentially, in order to prevent the radiofrequency tag 220 from being able to be damaged by the electronic device 200 upon the insertion thereof into the frame 110, a cavity is formed in the frame 110 in order to accommodate the radiofrequency tag 220. Similarly, the radiofrequency tag reader 210, or at the very least its radio antenna, can be situated on a lateral side of the casing of the electronic device 200. In this case, the radiofrequency tag 220 is likewise fixed to the frame such that the radiofrequency tag reader 210 can read said radiofrequency tag 220 once the electronic device is inserted into the frame 110.

The electronic device 200 is adapted to, in a phase of configuration of the electronic device 200, read the configuration information item included in the radiofrequency tag 220 by means of the radiofrequency tag reader 210 and determine a configuration of the electronic device 200 as a function of the configuration information item read.

Advantageously, if the radiofrequency tag 220 comprises an integrity information item, the electronic device 200 is adapted to, in the configuration phase, read this integrity information item and check the integrity of the configuration information item read by the radiofrequency tag reader 210 by means of the integrity information item.

According to the embodiment of the invention, and if the radiofrequency tag 220 permits, the radiofrequency tag reader 210 is adapted to write an information item on the radiofrequency tag 220.

According to one embodiment of the invention, the frame 110 comprises a support making it possible to fix the radiofrequency tag 220 removably. It can be a void comprising a retaining system (for example a magnet) making it possible to reversibly fix the radiofrequency tag 220. Thus, an operator can easily replace a radiofrequency tag 220 with another. The radiofrequency tag 220 can be fixed onto a removable support intended to be placed in the frame 110 in order to facilitate the handling of a radiofrequency tag 220. Said support can facilitate the gripping, reinforce the solidity or the protection of a radiofrequency tag 220.

FIG. 3 schematically illustrates an electronic device 300 intended to be inserted into a frame of an airplane and adapted to implement a configuration method according to an embodiment of the invention. The electronic device 300 and the electronic device 200 are identical.

The electronic device 300 comprises, possibly linked by a communication bus: a processor or CPU ("Central Processing Unit") 301; a memory MEM 302 of RAM ("Random Access Memory") and/or ROM ("Read Only Memory"), type, a radiofrequency tag reader 303, a storage module STCK 304 of internal storage type, a connector 305 and possibly one or more modules 30N of different kinds.

The electronic device 300 can thus comprise one or more modules 30N depending on the nature of the functions that the electronic device 300 can provide. A module 30N can for example comprise a smoke detection function. The storage module STCK 304 can be of the hard disk HDD ("Hard Disk Drive") or SSD ("Solid-State Drive") type, or of external storage medium reader type, such as a reader of SD ("Secure Digital") cards. The processor CPU 301 can store data on the storage module STCK 304 or read data stored on the storage module STCK 304. These data can correspond to configuration parameters of the electronic device 300, to information items read by the radiofrequency tag reader 303, or to information items determined by the HPP method for the connector 305. The radiofrequency tag reader 305 can be adapted to read different types of radiofrequency tag, for example a radiofrequency tag of RFID type, and more particularly of NFC type. The radiofrequency tag reader 305 can read data, such as a configuration or integrity information item, in a radiofrequency tag. According to an additional embodiment of the invention, the radiofrequency tag reader 303 can also write data in a radiofrequency tag, if the latter is of suitable class (class "2" or higher).

The processor CPU 301 is capable of executing instructions loaded into the memory MEM 302, for example from the storage module STCK 304, from the radiofrequency tag reader 303 or from another communication module 30N for example. When the electronic device 300 is powered up, the processor CPU 301 is capable of reading the memory MEM 302 for instructions and executing them. These instructions form a computer program causing the implementation, by the processor CPU 301, of all or some of the methods and steps described hereinbelow. Thus, all or some of the methods and steps described hereinbelow can be implemented in software form by execution of a set of instructions by a programmable machine, such as a DSP ("Digital Signal Processor") or a microcontroller. All or some of the methods and steps described hereinbelow can also be implemented in hardware form by a machine or a dedicated component, such as an FPGA ("Field-Programmable Gate Array") or an ASIC ("Application-Specific Integrated Circuit").

FIG. 4 schematically illustrates a method for configuring an electronic device intended to be inserted into a frame of an airplane according to an embodiment of the invention. The method is executed by an electronic device identical to the electronic device 200, 300 (hereinafter 200 for simplification).

The electronic device 200 is considered to have been previously inserted into a frame of the airplane, for example the frame 110. Possibly, the airplane comprises several frames that can accommodate the electronic device 200, the electronic device 200 being able to be inserted in one or other of these frames.

In a first step 401, the electronic device 200 being inserted into the frame 110, and consequently the connectors 202 and 111 being connected, the electronic device is powered up. This powering up can be done automatically upon the insertion of the electronic device 200, particularly if the connector 111 ensures an electrical power supply for the electronic device 200. The powering up can also be performed upon a powering up of a system of the airplane including the electronic device 200. The electronic device 200 then begins a configuration phase. Although not necessarily, this configuration phase can comprise a step (not represented) of reading of a configuration of the electronic device via an HPP method. In particular, the electronic device 200 can determine, via the HPP method, that a first radiofrequency tag, fixed to the frame 110, can be read, and that consequently a step 402 of reading the first radiofrequency tag must be executed. Alternatively, the electronic device 200 can execute the step 402 of reading a radiofrequency tag without knowing that a radiofrequency tag is present, the step failing in the absence of a radiofrequency tag as described hereinbelow.

In the step 402, the electronic device 200, via the radiofrequency tag reader 210, reads—or tries to read—a first radiofrequency tag. In other words, the radiofrequency tag reader 210 emits a radio signal making it possible to interrogate a possible first radiofrequency tag present.

In a step 403, the electronic device 200 determines if the step of reading a first radiofrequency tag has run successfully. In case of absence of response from any radiofrequency tag, or in case of a nonconforming response, the electronic device 200 indicates, in a step 404, that an error has occurred, and the configuration method stops there. If a radiofrequency tag is correctly read, the electronic device 200 reads the configuration information items contained in the first radiofrequency tag and goes on to the step 405. If the first radiofrequency tag comprises an integrity information item associated with the configuration information item, the electronic device 200 reads this integrity information item and checks the integrity of the configuration information item by means of the integrity information item read and a checking method.

The method for checking the integrity of the configuration information item can consist in checking an error correcting code (checking a checksum for example), in computing a hash or even in computing a digital signature. In the latter case, the electronic device 200 can retrieve a key, typically a public key, stored for example in the storage memory 304 of the electronic device 200 in order to be able to check the digital signature. If the checking of the integrity of the configuration information item fails, the electronic device 200 goes on to the step 404.

In a step 405, the electronic device 200 determines its configuration as a function of the configuration information item read. The electronic device 200 can comprise several configurations stored in a memory of the electronic device 200, the step 405 then consists in choosing the configuration adapted to the configuration information item read. Such is for example the case if the electronic device 200 is designed to be used in airplanes of different types.

The electronic device 200 can determine its configuration, or certain elements of its configuration, directly from the configuration information item. The configuration information item can thus comprise at least one of the following information items:

an IP ("Internet Protocol") address, an information item relating to a position of the electronic device 200 in the airplane (particularly in the case where the airplane comprises several devices similar to the electronic device 200), an information item relating to the type of the airplane in which the electronic device 200 is installed, and an information item relating to the activation or to the deactivation of a function of the electronic device 200.

The configuration method can end at the step 405 or else include subsequent optional steps, beginning at the step 406. The configuration information item can comprise an information item allowing the electronic device 200 to determine if the steps 406 and subsequent steps must be executed. As for the step 402, the electronic device 200 can also try to read a second radiofrequency tag, without knowing in advance if a second radiofrequency tag is indeed present.

In the optional step 406, the electronic device 200 reads, or tries to read, a second radiofrequency tag.

In a step 407, the electronic device 200 checks, in a way similar to the step 403, whether the reading of the second radiofrequency tag has indeed been successful. In an identical way, the second radiofrequency tag can include an integrity information item.

In a step 408, the electronic device 200 reads the configuration information item from the second radiofrequency tag. This configuration information item can be a binary code, executable by the processor 301 of the electronic device 200, or else by a dedicated module included in the electronic device 200. Thus, a binary code can be supplied to the electronic device 200 in order to perform a function associated with this binary code. The electronic device 200 can thus be a so-called "generic" electronic device, different functions being able to be loaded into the electronic device 200 by means of binary codes read by the radiofrequency tag reader 210. The functions fulfilled by the electronic device then become dependent on the frame in which the electronic device is inserted, or more specifically on the radiofrequency tag or tags fixed to the frame.

The configuration information item read in the step 406 can be of the same kind as that read in the step 402, the use of several radiofrequency tags making it possible to increase the storage capacity and therefore the size of the configuration read by the electronic device 200.

In a step 409, the electronic device 200 is configured and can execute different functions, in particular those for which the electronic device 200 has retrieved the binary codes in the step 406.

If the first or the second radiofrequency tag is accessible in write mode and the radiofrequency tag reader 210 is adapted to write an information item on a radiofrequency tag, then the electronic device 200 can write information items on the corresponding radiofrequency tag. Thus, information items can be stored on a radiofrequency tag fixed to a frame and thus transmitted to an electronic device coming to replace a preceding electronic device, possibly faulty, on the same frame. The information items written in one of the radiofrequency tags by the radiofrequency tag reader 210 can in particular correspond to at least one of the following information items:

a version number corresponding to the latest version of software downloaded into the electronic device 200 (making it possible to retrieve the same version of the software in case of replacement of the electronic device 200), a value of a setting associated with the airplane, corresponding for example to the alignment of sensors or of a Head Up Display (HUD) device, an information item relating to a failure of the electronic device 200, and a decryption or control key that can be used when downloading software into the electronic device 200 (particularly when a new value of the key can be received by the electronic device 200 upon an updating of software in order to use this new value of the key for subsequent software downloads).

In a particular embodiment, when the first or the second radiofrequency tag is accessible in write mode, the writing of an information item on one of the radiofrequency tags can be performed by means of a portable radiofrequency tag reader, used for example by a maintenance operative of an airline operating the aircraft. In particular, this portable radiofrequency tag reader is a smartphone or a tablet provided with an appropriate software application.

The invention claimed is:

1. A system embedded in an airplane, the system comprising: an electronic device configured to be inserted into a first connector of a frame that configured to accommodate the electronic device the electronic device including a radiofrequency tag reader, and a second connector that mates with the first connector; a radiofrequency tag, having a configuration information item, and being configured such that the radiofrequency tag reader reads said radiofrequency tag when the electronic device is inserted into the frame; wherein: the electronic device is configured to, in a phase of configuration of the electronic device: obtain location configuration information encoded in the first connector of the frame; read the configuration information item via the radiofrequency tag reader; and determine a configuration of the electronic device as a function of the configuration information item read via the radiofrequency tag reader and location configuration information obtained from the first connector.

2. The system as claimed in claim 1, the electronic device being configured to provide at least one function to the airplane, the configuration information item comprising at least one of the following information items:

an IP address;

an information item relating to a position of the electronic device in the airplane;

an information item relating to the type of the airplane in which the electronic device is installed; or an information item relating to the activation or to the deactivation of a function of the electronic device.

3. The system as claimed in claim 1, the radiofrequency tag being accessible in write mode, the radiofrequency tag reader being configured to write an information item on the radiofrequency tag.

4. The system as claimed in claim 3, an information item written in the radiofrequency tag by the radiofrequency tag reader corresponding to at least one of the following information items:

a version number corresponding to a version of software downloaded into the electronic device;

a value of a setting associated with the airplane an information item relating to a failure of the electronic device; or a decryption or control key for downloading software into the electronic device.

5. An electronic device intended to be inserted into a frame of an airplane, the electronic device comprising:

a connector configured for connection with a connection system of a frame;

a radiofrequency tag reader configured to read a radiofrequency tag having a configuration information item when the electronic device is inserted into the frame, the electronic device being configured to, in a phase of configuration of the electronic device:

obtain location configuration information encoded in the connection system of the frame;

read the configuration information item via the radiofrequency tag reader; and determine a configuration of the electronic device as a function of the configuration information item read via the radio frequency tag reader and the location configuration information obtained from the connection system.

6. The electronic device as claimed in claim 5, the electronic device being configured to provide at least one function to an airplane, the configuration information item comprising at least one of the following information items:

an IP address;

an information item relating to a position of the electronic device in the airplane;

an information item relating to the type of the airplane in which the electronic device is installed; or an information item relating to the activation or to the deactivation of a function of the electronic device.

7. The electronic device as claimed in claim 5, the radiofrequency tag being accessible in write mode, the radiofrequency tag reader being configured to write an information item on the radiofrequency tag, an information item written in the radiofrequency tag by the radiofrequency tag reader corresponding to at least one of the following information items: a version number corresponding to a version of software downloaded into the electronic a value of a setting associated with an airplane; an information item relating to a failure of the electronic device; or a decryption or control key for downloading software into the electronic device.

8. A method for configuring an electronic device intended to be inserted into a frame of an airplane, the electronic device having a radiofrequency tag reader, a radiofrequency tag being fixed to the frame such that the radiofrequency tag reader reads said radiofrequency tag when the electronic device is inserted into the frame, the method being executed by the electronic device and comprising: obtaining location configuration information encoded in the connection system of the frame; reading the configuration information item via the radiofrequency tag reader; and determining a configuration of the electronic device as a function of the configuration information item read via the radiofrequency tag reader; and the location configuration information obtained from the connection system.

9. The method as claimed in claim 8, the electronic device being configured to provide at least one function to an airplane, the configuration information item comprising at least one of the following information items:

an IP address;

an information item relating to a position of the electronic device in the airplane;

an information item relating to the type of the airplane in which the electronic device is installed; or an information item relating to the activation or to the deactivation of a function of the electronic device.

10. A computer readable medium configured for storing a computer program, which comprises instructions for implementing, by a processor, the method for configuring an electronic device as claimed in claim 8, when the computer program is executed by the processor.

\* \* \* \* \*